United States Patent [19]

Brower

[11] 4,427,368
[45] Jan. 24, 1984

[54] SUBMINIATURE ARRAY WITH RETAINING REFLECTOR

[75] Inventor: Boyd G. Brower, Williamsport, Pa.

[73] Assignee: GTE Products Corporation, Stamford, Conn.

[21] Appl. No.: 359,465

[22] Filed: Mar. 18, 1982

[51] Int. Cl.³ .............................................. F21K 5/02
[52] U.S. Cl. .................................... 431/359; 29/838; 361/405; 362/15
[58] Field of Search ................ 431/357, 359; 361/405, 361/406; 362/11, 13, 15; 29/838, 861

[56] References Cited

U.S. PATENT DOCUMENTS 3,458,270  7/1969  Ganser et al. ........................ 431/359
3,473,880 10/1969  Wick ................................... 431/359
4,243,371  1/1981  Kewley et al. ......................... 431/13
4,287,559  8/1981  Audesse et al. ....................... 362/15
4,334,262  6/1982  Latos .................................. 362/11

Primary Examiner—Lee E. Barrett
Attorney, Agent, or Firm—Thomas H. Buffton

[57] ABSTRACT

A miniaturized multilamp photoflash array includes an envelope with a printed circuit of spaced electrical conductors on an inner surface, a plurality of flashlamps each having a pair of electrically conductive leads and a reflector unit affixed to the envelope and having a formed member forcing the conductive leads against the printed circuit and a sonic projection sealed to the envelope intermediate the spaced electrical conductors of the printed circuit.

7 Claims, 3 Drawing Figures

U.S. Patent  Jan. 24, 1984  4,427,368
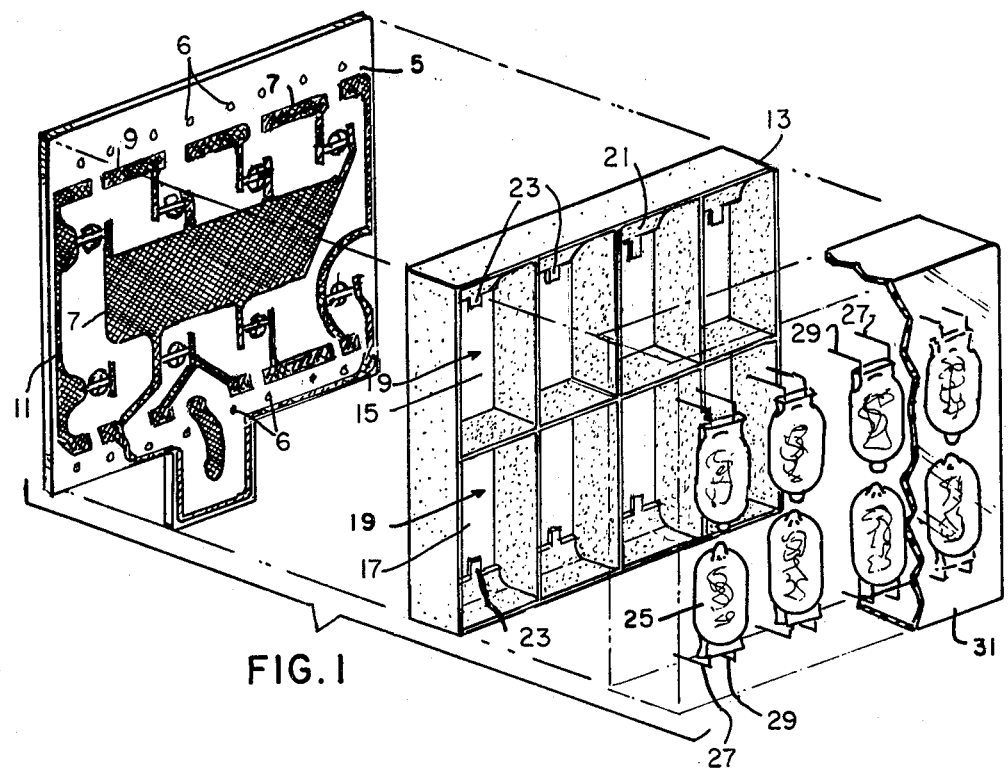
FIG. 1
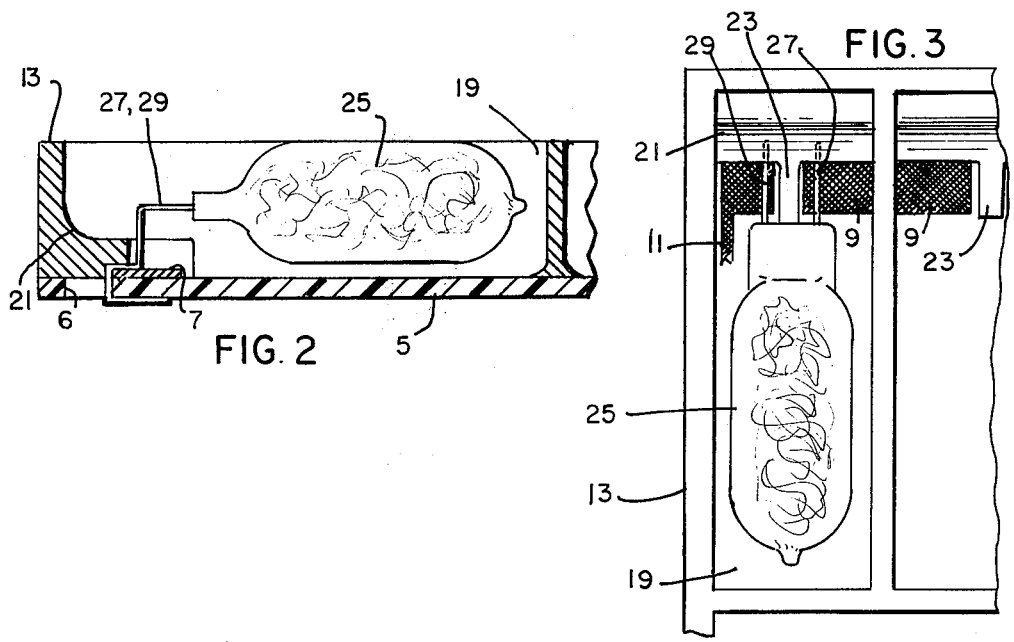
FIG. 2
FIG. 3

01
SUBMINIATURE ARRAY WITH RETAINING REFLECTOR

CROSS REFERENCE TO OTHER APPLICATIONS

A concurrently filed application, bearing U.S. Ser. No. 359,468, filed Mar. 18, 1982, entitled "Subminiature Photoflash Array," filed in the names of John W. Shaffer and David W. Mecone and assigned to the assignee of the present application, relates to an open-backed reflector unit for securing the leads of a plurality of flashlamps. Another concurrently filed application, bearing U.S. Ser. No. 359,467, filed Mar. 18, 1982, entitled "Multilamp Photoflash Array Fabrication," filed in the name of Donald E. Armtrong and assigned to the assignee of the present application, suggests a wrapping process for lead wires to provide an array.

TECHNICAL FIELD

This invention relates to subminiature multilamp photoflash arrays and more particularly to subminiature multilamp photoflash arrays wherein a reflection unit is utilized to insure electrical contact between a printed circuit and electrically conductive leads of the lamps and is affixed to an envelope intermediate a pair of electrically conductive paths of the printed circuit.

BACKGROUND ART

Generally, multilamp photoflash arrays require a support for a printed circuit, a plurality of photoflash lamps each having electrically conductive leads and a means for contacting the electrically conductive leads and the printed circuit. Also, it is common to provide a reflector unit whereby efficiency and output of the flashlamps are enhanced.

Ordinarily, the photoflash array provides sufficient space such that the more common techniques, such as eyelets crimped or mounted in a circuit board or staking of the leads, are satisfactory for attachment therebetween the electrical leads of the lamps and the printed circuit. However, miniature and subminiature arrays are much more restricted insofar as available space is concerned. Thus, bulky and relatively expensive items such as eyelets and fasteners are less than satisfactory for miniaturized multilamp arrays. Moreover, eyelets, staking and soldering processes all impose limitations on the materials suitable to or usable in such miniature arrays.

One known attachment technique for a miniature photoflash array is disclosed in a pending application entitled "Miniature Multilamp Photoflash Array," filed June 29, 1981, bearing U.S. Ser. No. 277,797 and assigned to the assignee of the present application. Therein, a miniature array includes a plurality of photoflash lamps each having a pair of electrical conductors and a reflector unit with a plurality of apertures wherein the electrical conductors pass through the apertures and are supported by the reflector unit. The reflector unit is then affixed to a support having a printed circuit thereon such that contact between the electrical conductors and the printed circuit is effected.

Although the above-described array is an improvement over prior known structures, it has been found that the structure does leave something to be desired. For example, it has been found that miniaturized arrays tend to have a relatively small spacing intermediate the electrically conductive paths of the printed circuit. As a result, the tendency toward arcing between the conductive paths of the printed circuit increases as the size of the total structure is reduced. Moreover, positioning of the reflector unit with respect to the printed circuit becomes more critical as the size is reduced and contact between the electrical conductors of the lamp and the printed circuit is attempted.

OBJECTS AND SUMMARY OF THE INVENTION

An object of the present invention is to provide an improved miniaturized multilamp photoflash array.

Another object of the invention is to enhance the electrical contact capabilities of a multilamp photoflash array.

Still another object of the invention is to improve the arc resistant properties of a miniaturized multilamp photoflash array.

A further object of the invention is to enhance the electrical contact between the flashlamps and printed circuit while reducing the arcing tendencies of the printed circuit in a miniaturized multilamp photoflash array.

These and other objects advantages and capabilities are achieved in one aspect of the invention by a miniaturized multilamp photoflash array having an envelope with front and back portions, a printed circuit having spaced electrical conductive paths on the inner surface of the back portion, a plurality of flashlamps having electrically conductive leads and a reflector unit formed to enhance contact between the printed circuit and the electrically conductive leads of the flashlamps and inhibit arcing between the spaced electrically conductive paths of the printed circuit.

BRIEF DESCRIPTION OF THE DRAWINGS

FIG. 1 is an isometric view, exploded, of a preferred form of miniaturized photoflash array;

FIG. 2 is a cross-sectional illustration of an embodiment of the invention; and

FIG. 3 is a plan view of a preferred embodiment of the invention illustrated in FIG. 2.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Referring to the drawings, FIG. 1 illustrates a miniaturized multilamp photoflash array. Herein an envelope includes a back portion or circuit board 5 having a printed circuit 7 on an inner surface. The printed circuit 7 has a plurality of circuit pads 9 providing electrical contact areas. Also, the printed circuit 7 includes a plurality of spaced electrically conductive paths 11 providing a passageway for electrical currents and exhibiting a potential therebetween.

A reflector unit 13 includes first and second rows 15 and 17 of spaced cavities 19. Each of the cavities 19 has a substantially open-back portion with a formed member 21 and a sonic projection 23 therein which will be further explained hereinafter. The reflector unit 13 is affixed to the circuit board 5. Also, a plurality of flashlamps 25 each having first and second electrically conductive leads 27 and 29 are nested within the cavities 19 of the reflector unit 13 with each of the conductive leads 27 and 29 contacting the circuit pads 9 of the printed circuit 7. Moreover, a plastic cover member 31 is telescoped over the flashlamps 25, reflector unit 13 and printed circuit 7 and affixed to the circuit board 5.

Referring to the cross-sectional illustration of FIG. 2 and the plan view of FIG. 3, the circuit board 5 includes a plurality of apertures 6 and a printed circuit 7 affixed to the inner surface thereof. The printed circuit 7 also includes a plurality of spaced conductive paths 11.

A reflector unit 13 is affixed to the circuit board 5 and includes a plurality of cavities 19 wherein a flashlamp 25 having a pair of electrically conductive leads 27 and 29 is nested. The reflector unit 13 is an essentially open-backed structure with a formed member 21 extending into each of the cavities 19. The electrically conductive leads 27 and 29 of each of the flashlamps 25 are formed to pass through the apertures 6 and bent to capture the circuit board 5.

Additionally, the formed member 21 of the reflector unit 13 is configured in a manner to exert a force on and capture the electrically conductive leads 27 and 29 intermediate thereto and the circuit pads 9 on the circuit boad 5. In other words, the reflector unit 13 is attached to the circuit board 5 and formed such that the formed member 21 thereof exerts a force pressing the electrically conductive leads 27 and 29 against the circuit pads 9. Thus, electrical contact between the electrically conductive leads 27 and 29 and the circuit pads 9 is insured by the formed member 21.

Finally, the sonic projections 23 of the reflector unit 13 extends intermediate the circuit pads 9 of the printed circuit 7 and are affixed to the circuit board 5. Thus, the sonic projection 23 serves as an insulating barrier intermediate the circuit pads 9. As a result, it has been found that the spacing intermediate the circuit pads 9 may be reduced without an increase in arcing therebetween.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

A unique miniaturized multilamp photoflash array includes not only an open-backed reflector unit whereby flashlamps nested therein occupy a reduced space but also provides improved insulating capabilities intermediate the electrically conductive runs of a printed circuit. Moreover, the enhanced structure and results are achieved at minimal increase in either labor or material costs.

I claim:

1. A miniaturized multilamp photoflash array having an envelope with a circuit board having a printed circuit of spaced electrical conductors on an inner surface thereof and a light transmittable cover member; a plurality of miniaturized photoflash lamps each having a pair of electrically conductive leads extending outwardly therefrom; and a reflector unit having cavities wherein said lamps are nested and said electrically conductive leads pass therethrough, said reflector unit affixed to said circuit board and having a retaining member forcing said electrically conductive leads against said printed circuit and a sonic projection sealed intermediate said spaced electrical conductors on said circuit board.

2. The miniaturized multilamp photoflash array of claim 1 wherein said circuit board includes apertures and said electrically conductive leads of said flashlamps pass through said apertures.

3. The miniaturized multilamp photoflash array of claim 1 wherein said reflector unit includes a plurality of spaced cavities, a flashlamp is nested within each cavity and said reflector unit has a retaining member positioned within each cavity to exert pressure on and secure said electrically conductive leads of said flashlamps against said printed circuit.

4. In a miniaturized multilamp photoflash array having an envelope with a back portion having a printed circuit of space electrical conductors on an inner surface thereof and a light transmittable front portion, a plurality of miniaturized photoflash lamps each having a pair of electrically conductive leads and disposed within a reflector unit having a plurality of lamp receiving cavities, said electrically conductive leads passing through said cavities of said reflector unit, said array characterized by the improvement wherein said reflector unit is affixed to said back portion of said envelope, said electrical leads pass through said printed circuit board, and said reflector unit includes a formed member in each cavity for exerting a force on said electrical leads to insure contact of said electrical conductors of said printed circuit by said electrically conductive leads of said photoflash lamps.

5. The improvement of claim 4 wherein said reflector unit includes at least one formed member having a sonic projection with said sonic projection extending between said pair of electrically conductive leads of at least one of said flashlamps.

6. The improvement of claim 4 wherein said electrically conductive leads of said miniaturized photoflash lamps pass through said reflector unit.

7. The improvement of claim 4 wherein said back portion of said envelope includes apertures therein and said electrically conductive leads of said miniaturized photoflash lamps pass through said apertures.

* * * * *